(12) United States Patent
Shirota et al.

(10) Patent No.: US 11,211,464 B2
(45) Date of Patent: Dec. 28, 2021

(54) NORMALLY-OFF NITRIDE SEMICONDUCTOR TRANSISTOR DEVICE

(71) Applicants: Riichiro Shirota, Kanagawa (JP); Shinichiro Takatani, Tokyo (JP)

(72) Inventors: Riichiro Shirota, Kanagawa (JP); Shinichiro Takatani, Tokyo (JP)

(*) Notice: Subject to any disclaimer, the term of this patent is extended or adjusted under 35 U.S.C. 154(b) by 80 days.

(21) Appl. No.: 16/705,587

(22) Filed: Dec. 6, 2019

(65) Prior Publication Data

US 2020/0185506 A1 Jun. 11, 2020

(30) Foreign Application Priority Data

Dec. 6, 2018 (JP) .............................. JP2018-229059

(51) Int. Cl.
*H01L 29/423* (2006.01)
*H01L 29/205* (2006.01)
(Continued)

(52) U.S. Cl.
CPC .... *H01L 29/42324* (2013.01); *H01L 29/0696* (2013.01); *H01L 29/2003* (2013.01);
(Continued)

(58) Field of Classification Search
CPC ............. H01L 29/42324; H01L 29/205; H01L 29/41758; H01L 29/0696; H01L 29/7787;
(Continued)

(56) References Cited

U.S. PATENT DOCUMENTS

| 7,687,828 B2 * | 3/2010 | Matsuo ................ H01L 29/155 257/194 |
| 9,899,507 B2 | 2/2018 | Shirota et al. |

(Continued)

FOREIGN PATENT DOCUMENTS

| JP | S60106175 A | 6/1985 |
| JP | 2011192944 A | 9/2011 |
| JP | 2017123383 A | 7/2017 |

OTHER PUBLICATIONS

Yasuhiro Uemoto, Masahiro Hikita, Hiroaki Ueno, Hisayoshi Matsuo, Hidetoshi Ishida, Manabu Yanagihara, Tetsuzo Ueda, Tsuyoshi Tanaka and Daisuke Ueda, Gate Injection Transistor (GIT)—A Normally-Off AlGaN/GaN Power Transistor Using Conductivity Modulation, IEEE Transactions on Electron Devices, Dec. 2007, pp. 3393-3399, vol. 54, No. 12, IEEE Electron Devices Society, USA.
(Continued)

*Primary Examiner* — Duy T Nguyen

(74) *Attorney, Agent, or Firm* — Alan D. Kamrath; Karin L. Williams; Mayer & Williams PC

(57) ABSTRACT

A nitride semiconductor transistor device is disclosed. The device includes a first nitride semiconductor layer disposed over a substrate, and a second nitride semiconductor layer with a band gap larger than the first nitride semiconductor disposed over the first nitride semiconductor layer. Over the second nitride semiconductor layer, a first insulating film, a charge-storing gate electrode, a second insulating film, and a second gate electrode are formed in order thereon. A source electrode and a drain electrode are disposed over the second nitride semiconductor layer interposing the charge-storing gate electrode in a plane direction. The device further includes a first gate electrode capacitively coupling with the charge-storing gate electrode with an insulating film therebetween forming a first capacitor, and the charge-storing gate electrode is charged by an electron injection from the first gate electrode through the first capacitor.

24 Claims, 12 Drawing Sheets

(51) Int. Cl.
  *H01L 29/417* (2006.01)
  *H01L 29/06* (2006.01)
  *H01L 29/778* (2006.01)
  *H01L 29/20* (2006.01)

(52) U.S. Cl.
  CPC ...... *H01L 29/205* (2013.01); *H01L 29/41758* (2013.01); *H01L 29/7787* (2013.01)

(58) Field of Classification Search
  CPC ............... H01L 29/2003; H01L 29/788; H01L 29/4238; H01L 29/402; H01L 29/42356; H01L 29/7786
  USPC .......................................................... 257/76
  See application file for complete search history.

(56) References Cited

U.S. PATENT DOCUMENTS

2007/0187718 A1* 8/2007 Suzuki .............. H01L 29/66462
       257/194
2014/0097470 A1* 4/2014 Kim .................. H01L 29/66462
       257/194
2017/0194474 A1* 7/2017 Shirota ............. H01L 29/41758
2018/0090603 A1* 3/2018 Yamada ............. H01L 21/0254
2019/0051672 A1* 2/2019 Lee .................... H01L 27/1218

OTHER PUBLICATIONS

Masahito Kanamura, Toshihiro Ohki, Toshihide Kikkawa, Kenji Imanishi, Tadahiro Imada, Atsushi Yamada, and Naoki Hara, Enhancement-Mode GaN MIS-HEMTs with n—GaN/—A1N/n—GaN Triple Cap Layer and High-k Gate Dielectrics, IEEE Electron Device Letters, Mar. 2010, pp. 189-191, vol. 31, No. 3, IEEE Electron Devices Society, USA.

* cited by examiner

NORMALLY-OFF NITRIDE SEMICONDUCTOR TRANSISTOR DEVICE

CROSS REFERENCE TO RELATED APPLICATION

The application claims the benefit of Japanese application serial No. 2018-229059, filed on Dec. 6, 2018, and the entire contents of which are incorporated herein by reference.

BACKGROUND OF THE INVENTION

1. Field of the Invention

The present invention relates to a nitride semiconductor transistor device, especially relates to a so-called nitride semiconductor transistor device which implements normally-off, in which a conductive channel under the gate electrode of a field effect transistor is substantially off when there is no voltage applied to the gate electrode.

2. Description of the Related Art

The semiconductors consisting of nitride semiconductors such as GaN, AN, InN and their mixed crystals have a wide band gap as well as a high carrier mobility for the conduction electrons, and thus are suitable for use in a device operating with a high voltage and a high output. In particular, a field-effect transistor (FET) fabricated using the nitride semiconductor and also a high electron mobility transistor (HEMT), which uses the electrons induced at a semiconductor hetero junction interface such as AlGaN/GaN as a conductive channel, can operate at a high voltage, a large current and a low on-resistance, and can be used as a high output power amplifier or a large power switching element.

However, in the known ordinary nitride semiconductor FETs, the conductive channel under the gate electrode becomes ON in status without a voltage applied to the gate electrode. This is the so-called normally-on, and is not desirable for a switching element used in a power supply and the like in terms of safety consideration because the loss of the control voltage applied to the gate electrode due such as to a malfunction make the switch opened that may lead to damage to a whole device.

Therefore, several technologies are developed to make the nitride semiconductor FET normally-on. As one of the technologies, a method is known that a p-type nitride semiconductor layer is inserted directly under a gate of a FET to form a p-n junction type gate electrode, and thus a normally-off operation is obtained (please refer to non-patent literature published by Y. Uemoto et al., IEEE Transactions on Electron Devices Volume 54, Number 12, December 2007, p. 3393). In this technology, an operation range of the gate electrode is limited by a flat band voltage determined by the band gap of the semiconductor. Therefore, when a threshold voltage is made positive, its value is limited to 2 V or less. In a known ordinary power supply device, a positive threshold value of equal to or larger than 3V is desired. Therefore, a sufficiently large positive threshold value will not be obtained with this technology. Furthermore, a positive voltage which can be applied to the gate electrode is limited by a turn-on voltage of the p-n junction, so that an amplitude of the operational gate voltage becomes small, and the current which can flow through the conductive channel of the FET in the on-state is limited.

As another method of implementing normally-off, a method is known in which an insulating film is inserted directly under the gate of the FET to form the gate electrode of a Metal-Insulator-Semiconductor (MIS) junction type (please refer to non-patent literature published by M. Kanamura et al., IEEE Electron Device Letters, Volume 31, Number 3, March 2010, p.189.). In the method, an insulator exists under a gate metal, so a leakage current flowing through the gate electrode can be suppressed to a low value, and an application of a large and positive gate voltage becomes possible. Therefore, in comparison with a situation using the p-n junction in the gate electrode, even if the threshold voltage is made a large and positive value, the amplitude of the operational gate voltage can be sufficiently high.

FIG. 9 is a cross sectional view showing the structure of the main part of a conventional GaN FET having a gate electrode of the MIS type. For the material of substrate 1001, silicon carbide (SiC), silicon (Si), sapphire, GaN and the like can be used. On the substrate 1001, a buffer layer 1002, a GaN layer 1003, an AlGaN layer 1004, which are formed by an epitaxial growth, are laminated in order. The AlGaN layer 1004 in the part the gate electrode is formed is partially removed by a recess etching. In the recess etching part 1006, the gate electrode 1007 is formed of an insulating film 1005 inserted underneath. The main part of the GaN HEMT is finished by further forming a source electrode 1008 and a drain electrode 1009. As the material of the insulating film 1005, aluminum oxide, silicon oxide, silicon nitride, or other conventional gate insulating material can be used. A conductive channel 1010 is formed by the electrons induced at the GaN layer 1003 side of the interface between the GaN layer 1003 and the AlGaN layer 1004 with the band gap larger than the GaN layer 1003. The electron density of the conductive channel 1010 directly under the gate electrode 1007 is changed by the voltage applied to the gate electrode 1007, thus a transistor operation is obtained. This type of FET is one of so-called HEMTs being one of FETs, in which the conductive channel formed in the hetero interface of an AlGaN/GaN semiconductor is used.

FIG. 10 is a cross sectional view of another conventional example showing the cross sectional structure of the main part of a GaN FET having a gate electrode of the MIS type. It is the same as the conventional example shown in FIG. 9 where the silicon carbide (SiC), silicon (Si), sapphire, GaN and the like are used as the material of a substrate 1101. On the substrate 1101, a buffer layer 1102, a GaN layer 1103 and an AlGaN layer 1104, which are formed by the epitaxial growth, are laminated in order. As for the material of an insulating film 1105, it may be aluminum oxide, silicon oxide, silicon nitride, or other conventional gate insulating materials. The difference between this conventional example and the conventional example shown in FIG. 9 is that a recess etching part 1106 is deeper in this conventional example, and the bottom thereof extends through the AlGaN layer 1104 and reaches the GaN layer 1103. A source electrode 1108 and a gate electrode 1107 are electrically connected to each other by a conductive channel 1110 formed in the AlGaN/GaN interface. A drain electrode 1109 and the gate electrode 1107 are also electrically connected to each other by the conductive channel 1110. A conductive channel 1111 directly under the gate electrode is formed by the electrons induced in the interface between the insulating film 1105 and the GaN layer 1103. The electron density is changed by the voltage applied to the gate electrode 1107, thus the operation of the transistor is obtained.

In the conventional example shown in FIG. 9, the purpose of forming the recess etching part 1006 in the gate electrode part is to achieve normally-off by making the threshold voltage of the FET positive. The nitride semiconductor used in a conventional electronic device has a hexagonal crystal structure. Generally, due to the convenience of epitaxial growth, a layer grown in a c-axis direction is ordinarily used. In this case, along a direction (c-axis direction) orthogonal to a plane in the AlGaN layer 1004, a large polarization effect resulting from a piezoelectric polarization and a spontaneous polarization occurs in a substrate direction.

FIG. 11a and FIG. 11b show the band diagrams of a semiconductor layer of a lower part of the gate electrode. The band diagrams show the case in which the voltage is not applied to the gate. In contrast with the structure shown in FIG. 11a, FIG. 11b shows a situation that a thickness of the AlGaN layer 1004 is made thinner. In FIG. 11a and FIG. 11b, an energy value of a lower end of a conductive band 1201 is reduced as it becomes further away from the gate electrode because of the polarization (P) which exists in the AlGaN layer 1004. Therefore, as shown in FIG. 11a, if the thickness of the AlGaN layer 1004 is large, a ground quantum level in a triangular potential well formed at the interface between the AlGaN layer 1004 and the GaN layer 1003 is positioned under a Fermi level 1203 (labeled as "$E_F$" in the figure), and the electrons are induced in the quantum well to form the conductive channel 1010. The device is made normally-off by making the electrons induced in the conductive channel substantially zero in a case that the gate voltage is not applied. To achieve this, it is necessary to make the thickness of the AlGaN layer 1004 smaller as shown in FIG. 11b.

As described in M. Kanamura et al., IEEE Electron Device Letters, Volume 31, Number 3, March 2010, p. 189, for example, if the mixed crystal ratio of AlN of the AlGaN layer 1004 or x in a form of a chemical composition written as $Al_xGa_{1-x}N$ is 20%, it is necessary to make the thickness of the AlGaN layer 1004 of the lower part of the gate electrode 1007 about 2 nm. If x becomes large, it is necessary to make the AlGaN layer 1004 further thinner. On the other hand, in FIG. 9, in the regions between the source electrode 1008 and the gate electrode 1007, and between the drain electrode 1009 and the gate electrode 1007, it is necessary to make the thickness of the AlGaN layer 1004 about 10 nm or more such that sufficient number of electrons can be induced in the conductive channel 1010 formed at the AlGaN/GaN interface, and the resistance of the regions can be reduced. Therefore, as shown in FIG. 9, it is necessary to make the thick AlGaN layer 1004 grown in advance, then to etch only the part the gate electrode is formed by recess etching to make the AlGaN layer 1004 thinner. However, the threshold voltage varies with the thickness of the remaining AlGaN layer after etching. Therefore, in an actual situation of manufacturing the transistor, an etching depth of the recess etching part 1006 needs to be controlled precisely. Yet, when forming a large number of transistors on the substrate 1001 simultaneously, it is difficult to restrain in-plane variation of etching amount.

The conventional example shown in FIG. 9 has another problem. Usually, in the interface between the nitride semiconductor and the insulator, many trap levels exist within hundreds of millielectron volts below the lower end of the conduction band of the nitride semiconductor. FIG. 11c shows a situation where the AlGaN layer 1004 is made sufficiently thin and the transistor is made normally-off. FIG. 11c is a band diagram showing a situation that a positive gate voltage 1205 (labeled as "V" in the figure) is applied to the gate electrode 1007, and the electrons are induced in the conductive channel 1010. Because the trap level 1204 exists in the interface between the insulating film 1005 and the AlGaN layer 1004, when the positive gate voltage 1205 is applied, the Fermi level 1203 is fixed by the trap level 1204, and the inducement of electrons in the conductive channel 1010 resulting from the positive gate voltage 1205 is hindered. As a result, the on-resistance is not decreased, and the on-current is not increased. As such, the performance of the transistor as a switch is significantly deteriorated.

On the other hand, the conventional example shown in FIG. 10 is different from the situation of FIG. 9, in which the recess etching part 1106 extends through the AlGaN layer 1104 and reaches the GaN layer 1103. Therefore, the influence of the polarization in the AlGaN layer 1004 can be avoided, and an issue of the thickness control of the AlGaN layer after etching can be solved. However, the mobility of the electrons in the conductive channel 1111, which is formed at the interface between the insulating film 1105 and the GaN layer 1103, is several times smaller than the mobility of the electrons at the AlGaN/GaN interface. Therefore, in comparison with the so-called HEMT shown in FIG. 9, there is a problem that the transistor has a significantly decreased performance. Besides, even in this conventional example, similar to the conventional example shown in FIG. 9, a trap level, which exists at the interface between the insulating film 1105 and the GaN layer 1103, hinders the inducement of the electrons in the conductive channel 1111, thus causing a problem that the on-resistance is not decreased and the on-current is not increased. Thus, the performance of the transistor as a switch is deteriorated.

SUMMARY OF THE INVENTION

Therefore, the purpose of the present invention is to provide a novel normally-off nitride semiconductor transistor device which can solve the problem of the conventional nitride semiconductor FET described above.

In order to solve the problem above, a nitride semiconductor transistor device according to the first embodiment of the application has a substrate, a first nitride semiconductor layer which is disposed over the substrate, and a second nitride semiconductor layer which is disposed over the first nitride semiconductor layer and has a band gap larger than the first nitride semiconductor layer. The electrons induced near the interface between the first nitride semiconductor layer and the second nitride semiconductor layer form a conductive channel. A cell isolation region is formed by making an unwanted part of the conductive channel on the substrate inactive, for instance, by an ion implantation, or an etching of the first and second nitride semiconductor layers. Furthermore, the nitride semiconductor transistor device includes a first gate electrode which has a low resistance layer formed of metal or semiconductor and has at least one part thereof disposed over the cell isolation region, a first insulating film which has at least one part thereof disposed over the second nitride semiconductor layer, and a charge-storing gate electrode which has a low resistance layer formed of metal or semiconductor and disposed over the first insulating film. The charge-storing gate electrode forms a third capacitor by capacitive coupling with the conductive channel with the first insulating film therebetween. Furthermore, the third insulating film is disposed covering at least one part of the first gate electrode. The charge-storing gate electrode extends to and above the third insulating film and uses the third insulating film as a capacitive coupling film to form a first capacitor by capacitively coupling with the first gate electrode. As a preferable form, the third insulating film is formed by at least partially covering the upper surface and the side surface of the first gate electrode, and the charge-storing gate electrode is also disposed to cover the upper surface and the side surface of the first gate electrode to at least partly use the third insulating film there as the capacitive coupling film. Besides, a second insulating film is disposed over the charge-storing gate electrode, and a second gate electrode is disposed over the second insulating film. The charge-storing gate electrode capacitively couples with the second gate electrode with the second insulating film therebetween to form a second capacitor. A negative charge can be stored in the charge-storing gate electrode by applying a voltage between the first gate electrode and the second gate electrode. Besides, a source electrode and a drain electrode are disposed over the second nitride semiconductor layer by interposing the charge-storing gate electrode in a plane direction. The threshold value of a voltage applied to the second gate electrode or a voltage simultaneously applied to the first gate electrode and the second gate electrode to cut off the current flowing through the conductive channel and between the source electrode and the drain electrode (threshold voltage) is made positive by the negative charge stored in the charge-storing gate electrode.

A nitride semiconductor transistor device according to the second embodiment of the application has a substrate, a first nitride semiconductor layer which is disposed over the substrate, and a second nitride semiconductor layer which is disposed over the first nitride semiconductor layer and has a band gap larger than the first nitride semiconductor layer. The electrons induced near an interface between the first nitride semiconductor layer and the second nitride semiconductor layer form a conductive channel. Furthermore, the nitride semiconductor transistor device has a fourth insulating film having at least one part thereof disposed on the second nitride semiconductor layer, a first gate electrode disposed over the fourth insulating film, a first insulating film having at least one part thereof disposed over the second nitride semiconductor layer, and a charge-storing gate electrode which is fabricated from a low resistance layer formed of metal or semiconductor and disposed over the first insulating film. The charge-storing gate electrode forms a third capacitor by capacitively coupling with the conductive channel through the first insulating film. Furthermore, a third insulating film is disposed over the upper surface and the side surface of the first gate electrode. The charge-storing gate electrode extends to and above the third insulating film. The charge-storing gate electrode forms a first capacitor by capacitively coupling with the first gate electrode through the third insulating film. Besides, a second insulating film is disposed over the charge-storing gate electrode and a second gate electrode is disposed over the second insulating film. The charge-storing gate electrode forms a second capacitor by capacitively coupling with the second gate electrode through the second insulating film. A negative charge can be stored in the charge-storing gate electrode by applying a voltage between the first gate electrode and the second gate electrode. Besides, a source electrode and a drain electrode are disposed over the second nitride semiconductor layer interposing the charge-storing gate electrode in a plane direction. The threshold value of a voltage applied to the second gate electrode or a voltage simultaneously applied to the first gate electrode and the second gate electrode to cut off the current flowing through the conductive channel and between the source electrode and the drain electrode (threshold voltage) is made positive by the negative charge stored in the charge-storing gate electrode.

According to the first embodiment and the second embodiment of the application, a normally-off nitride semiconductor transistor device with a small variation in the threshold value can be obtained without reducing the thickness of the second nitride semiconductor layer through recess etching to make the threshold value positive, or can be obtained in a manner that the remaining thickness is still large enough even though the recess etching is employed. Furthermore, using a thicker second nitride semiconductor layer, the impact of the interface energy levels at the interface between the second nitride semiconductor layer and the first insulation film in increasing the current flowing through the conductive channel by applying a positive voltage to the second gate electrode or simultaneously to the first gate electrode and the second gate electrode is reduced. Thus, a normally-off nitride semiconductor transistor device which is excellent in the properties as a switch, such as the on-resistance, the on-current and the like, can be obtained.

In the two preferable forms of the embodiments described above, it is preferable that a capacitance of the first capacitor is larger than a capacitance of the third capacitor. Alternatively, in a situation that the voltage is simultaneously applied to the first gate electrode and the second gate electrode for intercepting the current flowing through the conductive channel, it is preferable that a sum of capacitances of the first capacitor and the second capacitor is larger than a capacitance of the third capacitor. Accordingly, the dependency of the on-resistance and the on-current on the voltage applied to the second gate electrode and the first gate electrode can be enhanced. For this purpose, for example, it is preferable that a dielectric constant of the second insulating film or the third insulating film is larger than a dielectric constant of the first insulating film. Alternatively, it is preferable that the area of the first capacitor which is formed between the charge-storing gate electrode and the first gate electrode using the third insulating film as a capacitive film, or the area of the second capacitor which is formed between the charge-storing gate electrode and the second gate electrode using the second insulating film as a capacitive film, is larger than the area of the third capacitor which is formed between the charge-storing gate electrode and the conductive channel using the first insulating film as a capacitive film.

In another preferable form of the first embodiment, the first nitride semiconductor layer is formed of GaN, and the second nitride semiconductor layer is formed of $Al_xGa_{1-x}N$ ($0<x\leq 1$). The conductive channel induced at the interface between GaN and $Al_xGa_{1-x}N$ has high electron mobility, so a normally-off nitride semiconductor transistor device which is excellent in properties such as on-resistance switching, on-current switching and the like can be obtained.

Furthermore, in another preferable form of the first embodiment, at least the lowermost layer of the first insulating film is formed of aluminum oxide. Because the aluminum oxide generates less number of interface energy levels at the interface with the nitride semiconductor layer, when the current flowing through the conductive channel induced at the interface between the first nitride semiconductor layer and the second nitride semiconductor layer is increased by increasing the positive voltage applied to the second gate electrode or the first gate electrode, the current is less easily affected by the interface energy level which exists at the interface between the second nitride semiconductor layer and the first insulating film. Thus, a normally-off nitride semiconductor transistor device which is excellent in properties such as on-resistance switching, on-current switching and the like can be obtained.

According to the first embodiment or the second embodiment of the application, a normally-off nitride semiconductor transistor device, which is excellent in properties such as on-resistance switching or on-current switching, and has small variations of the properties, can be obtained.

DETAILED DESCRIPTION OF THE INVENTION

Figure 1A:
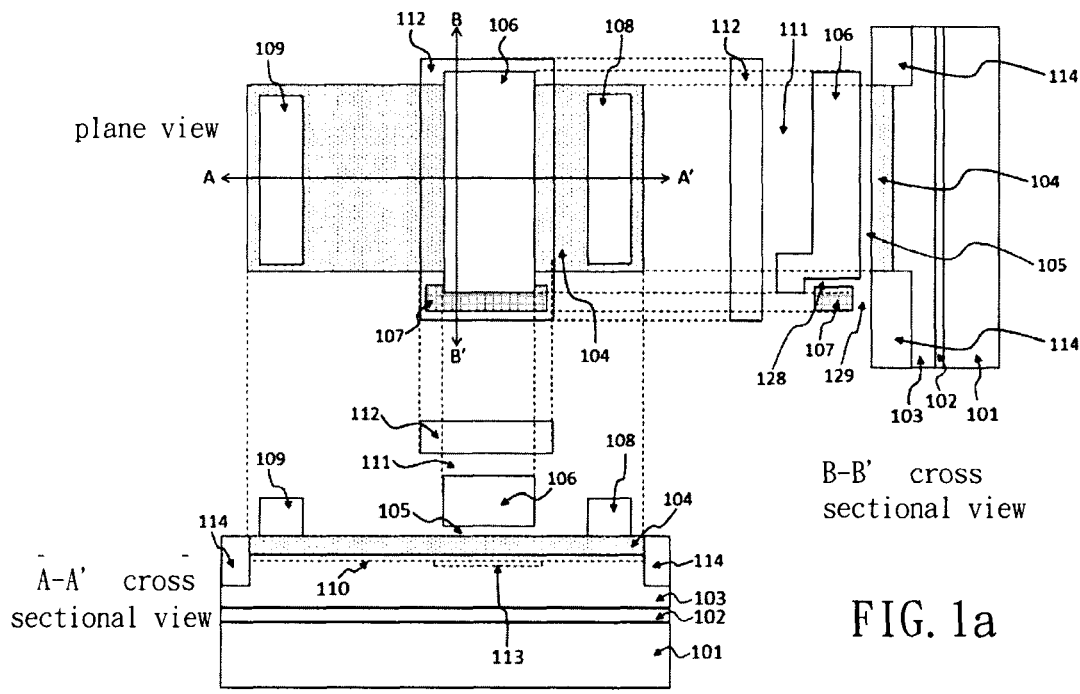
FIG. 1a shows a plane view and a cross sectional view of a FET of one form of the first embodiment of the application.
Figure 9:
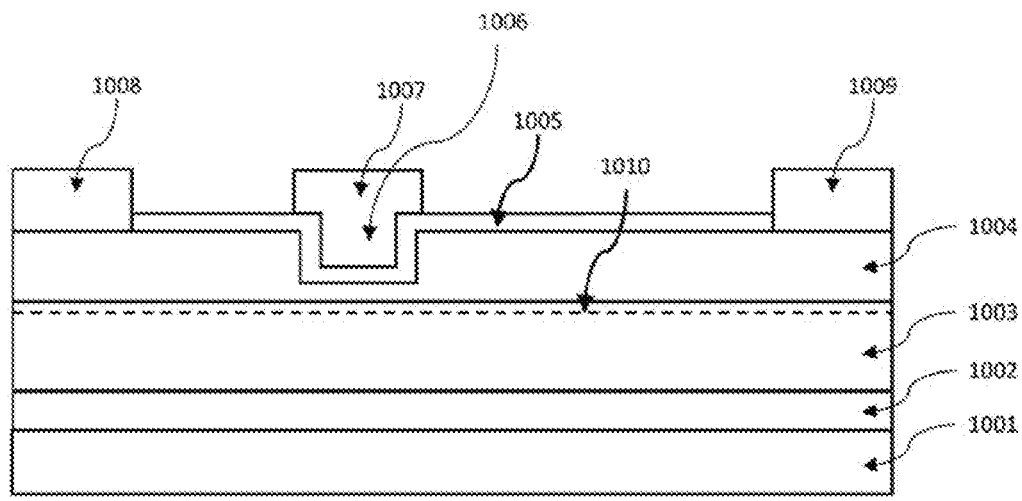
FIG. 9 shows a plane view and a cross sectional view of a FET of a conventional example.
Figure 10:
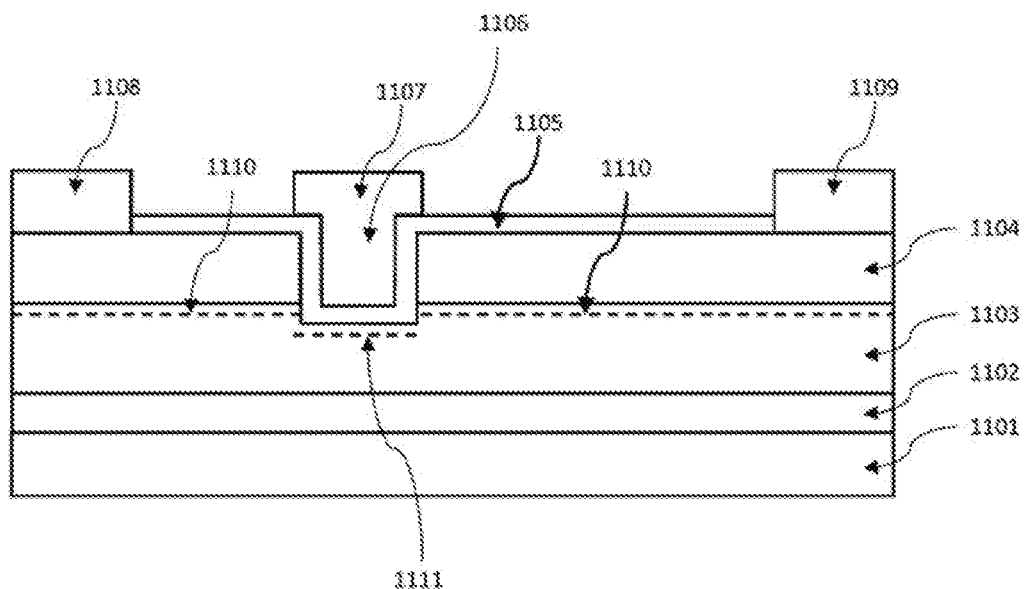
FIG. 10 is a cross sectional view of a FET of another conventional example.
Figure 11A:
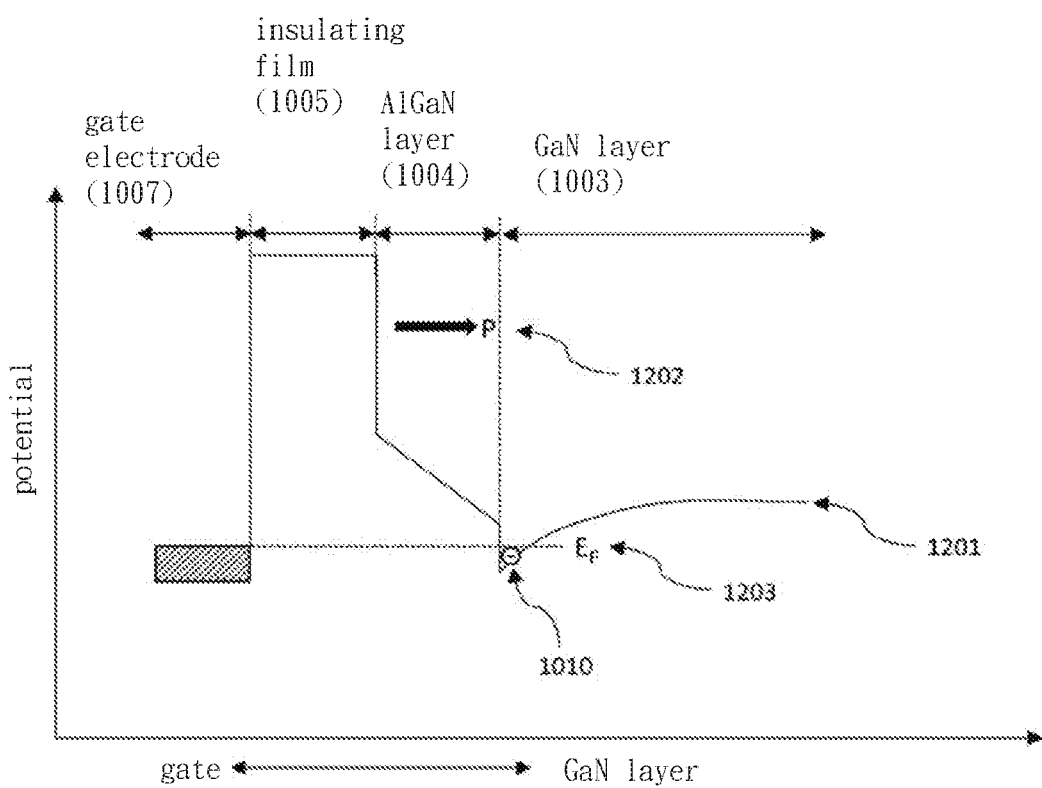
FIG. 11a shows a band diagram of a FET of a conventional example.
Figure 11B:
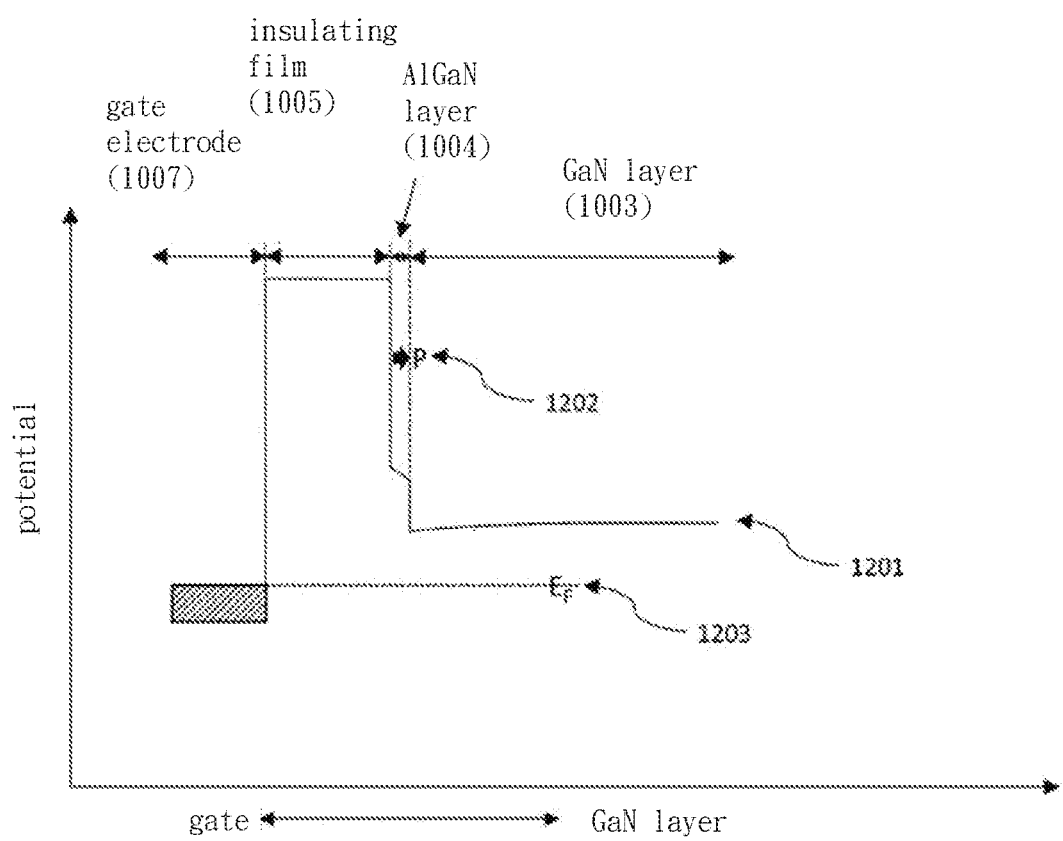
FIG. 11b also shows a band diagram of a FET of the conventional example.
Figure 11C:
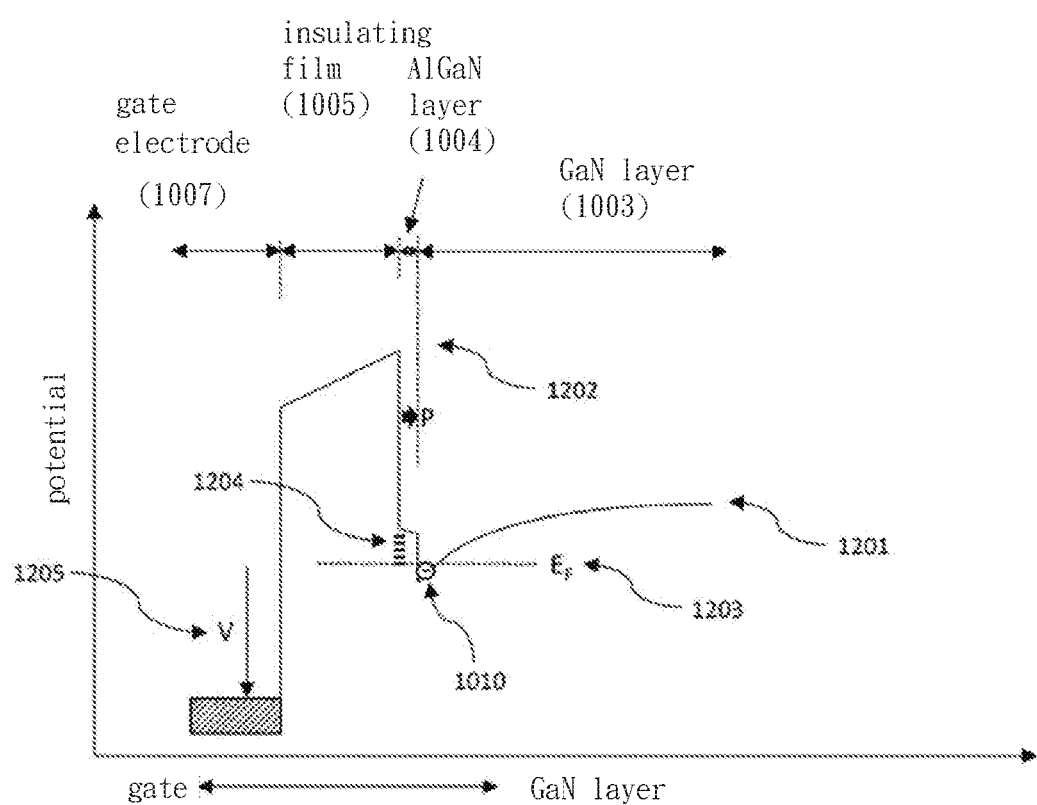
FIG. 11c also shows a band diagram of a FET of the conventional example.

FIG. 1a shows a plane view of a FET of one form of the first embodiment of the application and a cross sectional view along lines A-A' and B-B' thereof. On a substrate 101, a buffer layer 102, a GaN layer 103 and an AlGaN layer 104 are laminated in order. The substrate 101 and the buffer layer 102 are formed of the same materials as the conventional example illustrated in FIG. 9. Then, as shown in the plane view or the B-B' cross sectional view, a cell isolation region 114 is formed by making AlGaN layer 104, even together with the GaN layer 103 and the buffer layer 102 thereunder, electrically inactive by ion implantation. A method of removing the AlGaN layer 104, even together with the GaN layer 103 and the buffer layer 102 thereunder within the cell isolation region, can be used. The cell isolation method of another embodiment described later is the same as the one described above. Then, as shown in the plane view or the B-B' cross sectional view, a first gate electrode 107, which is formed of a low resistance material, either a metal or a semiconductor, is disposed on the cell isolation region 114 with a fourth insulating film 129 sandwiched therebetween. Then, a charge-storing gate electrode 106, which is formed of a low resistance material, either a metal or a semiconductor, is disposed on the second nitride semiconductor layer 104 with a first insulating film 105 sandwiched therebetween. The charge-storing gate electrode 106, which has at least one part thereof adjacent to the side surface and the upper surface of the first gate electrode 107 with the third insulating film 128 sandwiched therebetween on the cell isolation region 114, forms the first capacitor by capacitive coupling. Besides, the third insulating film 128 can also be formed of the same material of the insulating film at the time the first insulating film 105 is formed. Then, the second gate electrode 112 is disposed on the charge-storing gate electrode 106 with the second insulating film 111 sandwiched therebetween. The second gate electrode 112, which has at least one part thereof facing the upper surface of the charge-storing gate electrode 106 with the second insulating film 111 sandwiched therebetween, forms the second capacitor by capacitive coupling between the charge-storing gate electrode 106 and the second gate electrode 112. Next, or in the previous process, a source electrode 108 and a drain electrode 109 are disposed on the AlGaN layer 104 interposing the charge-storing gate electrode 106 in the in-plane direction on the AlGaN layer 104. On the other hand, a conductive channel 110, which is induced at the interface between the GaN layer 103 and the AlGaN layer 104, and the charge-storing gate electrode 106 form a third capacitor by capacitive coupling, and through this capacitive coupling, the voltage of the second gate electrode 112 or the voltage simultaneously applied to the first gate electrode 107 and the second gate electrode 112 can change the current flowing through the conductive channel 110 between the source electrode 108 and the drain electrode 109. The threshold value of a voltage applied to the second gate electrode 112 or a voltage simultaneously applied to the first gate electrode and the second gate electrode to cut off the current can be made positive by storing the negative charge in the charge-storing gate electrode 106. Besides, to prevent the leakage between the source electrode 108 and the drain electrode 109 of the FET, the edge of the charge-storing gate electrode 106 extends to the cell isolation region 114.

In the regions between the source electrode 108 and the charge-storing gate electrode 106 and between the drain electrode 109 and the charge-storing gate electrode 106, the thickness of the AlGaN layer 104 is made about 10 nm or more to induce sufficient number of electrons in the conductive channel 110 at the AlGaN/GaN interface to reduce the resistance of those regions. The mixed crystal ratio x of AlN of the AlGaN layer 104 where the chemical formula is written as $Al_xGa_{1-x}N$ is properly adjusted so as to prevent the lattice relaxation from significantly occurring in AlGaN which is different from GaN in the lattice constant. Typically, x is adjusted in a range from 0.1 to 0.4. The charge-storing gate electrode 106 is surrounded by the first insulating film 105, the second insulating film 111 and the third insulating film 128, and thus becomes electrically floating. Therefore, only the source electrode 108, the drain electrode 109, the first gate electrode 107 and the second gate electrode 112 are connected to external pins when packaged. Alternatively, there is also a method that the first gate electrode 107 and the second gate electrode 112 are short-circuited to make one external pin when packaged. Alternatively, the first gate electrode 107 can also be made floating and then packaged. The situation that there are four or three electrodes connected to the external pin is the same as the other embodiment described later. For the charge-storing gate electrode 106, a metal or a polycrystalline silicon doped with impurities can be used. For the polycrystalline silicon, phosphorus, arsenic, boron and the like are used as the impurities.

Figure 1B:
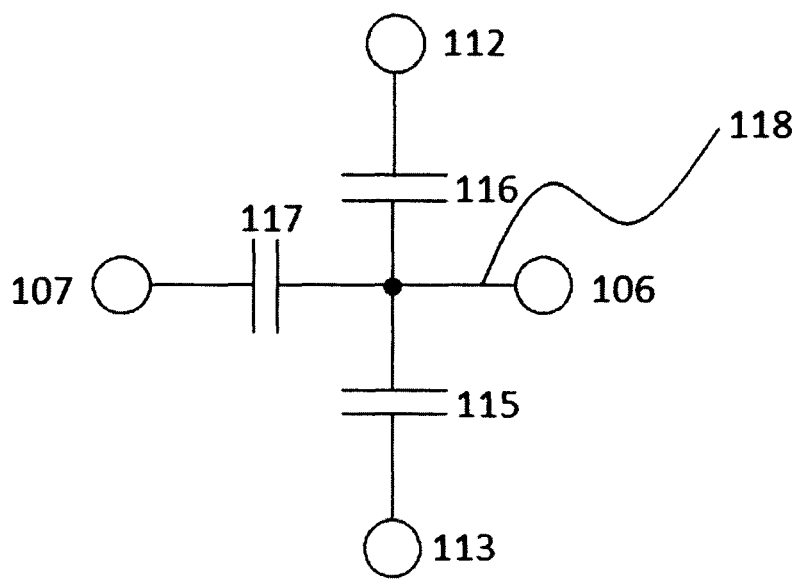
FIG. 1b is an equivalent circuit diagram of the capacitors between nodes of the FET of the first embodiment.

FIG. 1b shows the capacitors between each nodes of the FET shown in FIG. 1a. A third capacitor 115 is formed between the charge-storing gate electrode 106 and the conductive channel 110 directly thereunder. Besides, a capacitor 117 is formed between the charge-storing gate electrode 106 and the first gate electrode 107. A capacitor 116 is formed between the charge-storing gate electrode 106 and the second gate electrode 112. The capacitor 117 is the first capacitor, the capacitor 116 is the second capacitor, and the capacitor 115 is the third capacitor of the first embodiment of the application. The charge-storing gate electrode 106 is capacitively coupled with the first gate electrode 107 through the capacitor 117. Furthermore, the charge-storing gate electrode 106 is capacitively coupled with the conductive channel 110, especially with a conductive channel 113 directly under the gate, through the capacitor 115. Therefore, the electrical potential of the charge-storing gate electrode 106 is determined by each electrical potential of the first gate electrode 107, the second gate electrode 112 and the conductive channel 113 directly under the gate, and a charge 118 stored in the charge-storing gate electrode 106.

If the electrical potential of the source electrode 108, the electrical potential of the drain electrode 109, the electrical potential of the conductive channel 113 directly under the gate and the stored charge 118 in the charge-storing gate electrode 106 are fixed, the electrical potential of the charge-storing gate electrode 106 is determined by the electrical potential of the first gate electrode 107 and the electrical potential of the second gate electrode 112. If the electrical potential of the second gate electrode 112 or the first gate electrode 107 is made high, the electrical potential of the charge-storing gate electrode 106 also becomes high. Besides, if the electrical potential of the source electrode 108, the electrical potential of the drain electrode 109, the electrical potential of the first gate electrode 107 and the electrical potential of the second gate electrode 112 are fixed, the electrical potential of the charge-storing gate electrode 106 is determined by the stored charge 118 in the charge-storing gate electrode 106. If the stored charge 118 in the charge-storing gate electrode 106 is negative, the electrical potential of the charge-storing gate electrode 106 is decreased. Therefore, when the electrical potentials of the second gate electrode 112 and the first gate electrode 107 are made the same, a threshold voltage of the FET observed from the two gates is determined by the stored charge 118 in the charge-storing gate electrode 106. As shown schematically in FIG. 1c, if more negative charge is stored, the threshold voltage becomes higher. If a sufficient amount of negative charge is stored in the charge-storing gate electrode 106, the threshold voltage of the FET can be made 3V or more. Then, a sufficient normally-off state can be reached.

In order to enhance the dependency of the on-resistance or the on-current on the voltage applied to the second gate electrode 112 or the voltage applied to both the first gate electrode 107 and the second gate electrode 112, the capacitance of the capacitor 116 between the charge-storing gate electrode 106 and the second gate electrode 112, or the total capacitance including the capacitor 117 between the charge-storing gate electrode 106 and the first gate electrode 107, is made relatively larger than the capacitor 115 between the charge-storing gate electrode 106 and the conductive channel 113 directly under the gate.

Table 1 shows the voltage applied to each node for the injection of negative charge to the charge-storing gate electrode.

TABLE 1

| 112 | $V_{program}$ |
|---|---|
| 107 | $V_{low}$ (0 V) |
| 108 | Unconnected |
| 109 | Unconnected |

Figure 1C:
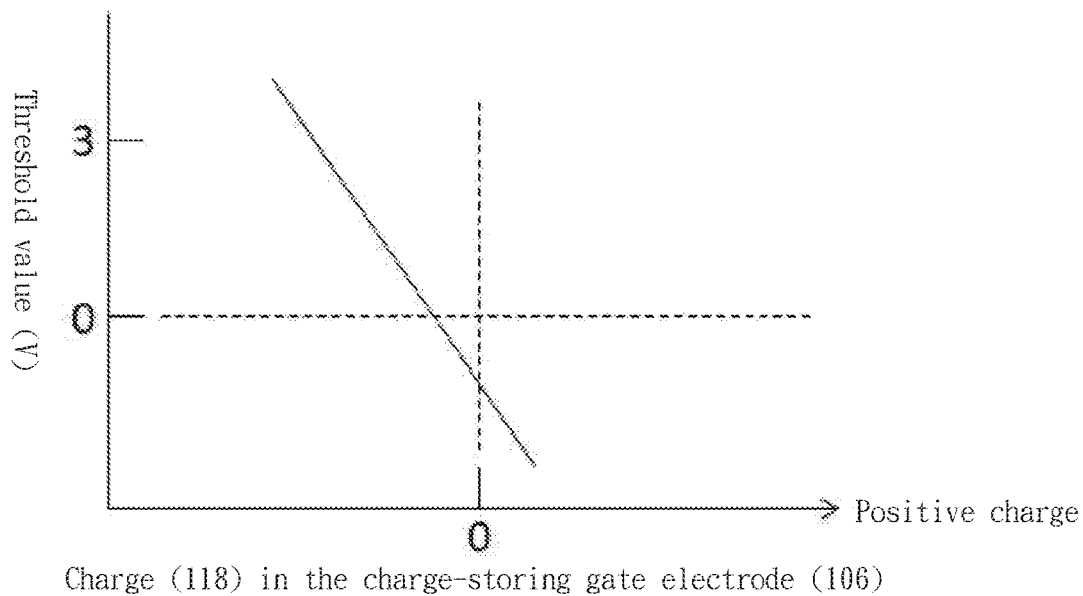
FIG. 1c shows diagram showing the relationship between the threshold value of the FET and the amount of storage charge stored in the charge-storing gate electrode for the case in which the second gate electrode and the first gate electrode are made the same electrical potential and the first and second gate electrodes together serve as a gate.
Figure 3:
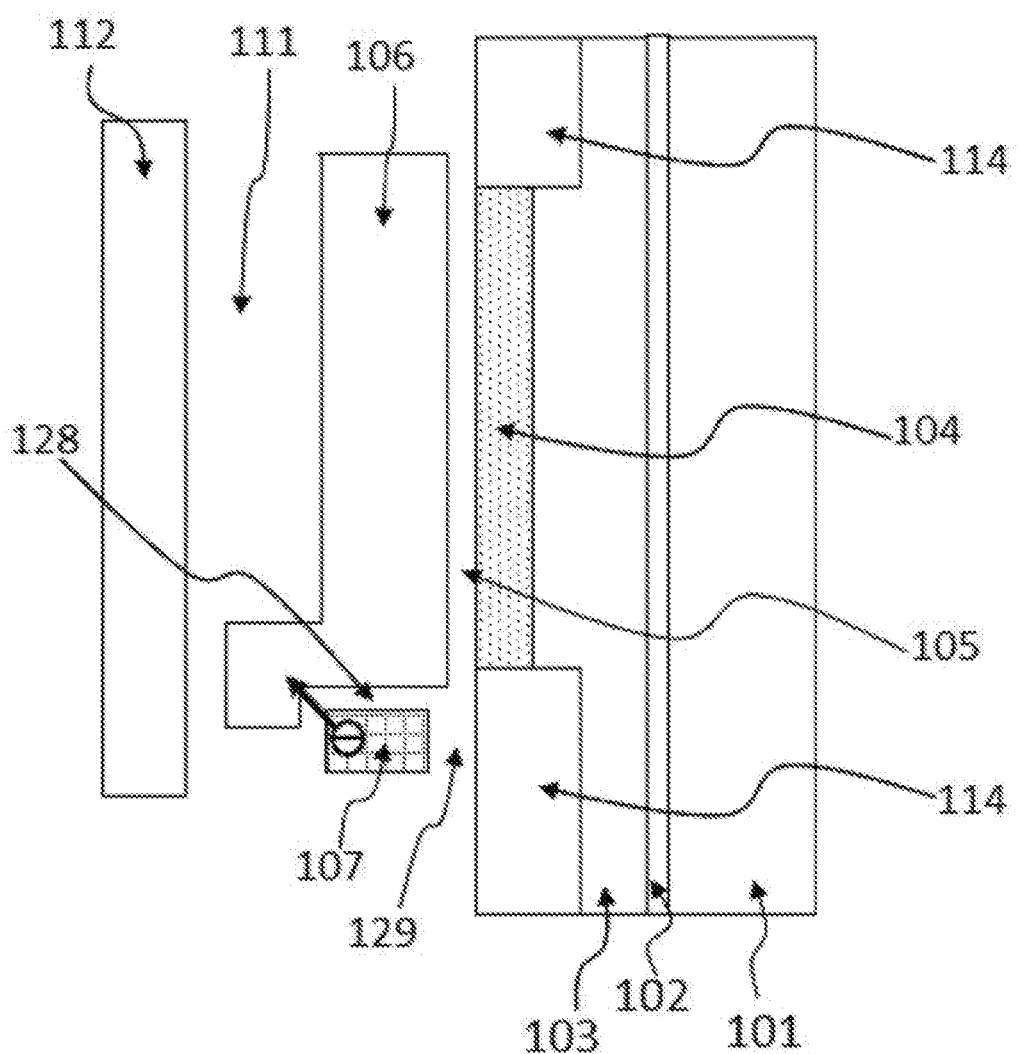
FIG. 3 is a cross sectional view of a FET where the electrons are injected into the charge-storing gate electrode.

The injection of electrons into the charge-storing gate electrode 106 is performed by applying the electrical potential shown in Table 1 to each node. That is, a certain high positive voltage $V_{program}$ is applied to the second gate electrode 112. The electrical potential $V_{low}$ lower than $V_{program}$, for example, 0V, is applied to the first gate electrode 107. Besides, the source electrode 108 and the drain electrode 109 are made floating. The electrical potential of the charge-storing gate electrode 106 becomes high between $V_{low}$ and $V_{program}$ by the capacitive coupling through the second capacitor 116 formed between the charge-storing gate electrode 106 and the second gate electrode 112 with the second insulating film 111. If the electric field between the charge-storing gate electrode 106 and the first gate electrode 107 is sufficiently large, the electrons are injected into the charge-storing gate electrode by tunneling through the third insulating film 128. Especially in a situation that the charge-storing gate electrode 106 overlaps from the upper surface to the side surface of the gate electrode as shown in FIG. 3, the sharp convex shape of the edge part of the first gate electrode 107 makes the electric field high. Thus, the electrons easily tunnel from the edge part to the charge-storing gate electrode 106. As shown in FIG. 1c, if more than a certain amount of electrons are injected into the charge-storing gate electrode 106, the threshold value of the FET, in which the first gate electrode 107 and the second gate electrode 112 are at same electrical potential, becomes positive.

Table 2 shows the voltage applied to each node when the negative charge is injected into the charge-storing gate electrode, which is different from the voltage shown in Table 1.

TABLE 2

| 112 | $V_{program}$ |
|---|---|
| 107 | $V_{low}$ (0 V) |
| 108 | $V_{program'}$ |
| 109 | $V_{program'}$ |

As the second method of injecting electrons to the charge-storing gate electrode 106, the electrical potential shown in Table 2 is to each node. That is, a certain high positive voltage $V_{program}$ is applied to the second gate electrode 112. The electrical potential $V_{low}$ which is lower than $V_{program}$, for example, 0V, is applied to the first gate electrode 107. $V_{program'}$ is applied to the source electrode 108 and the drain electrode 109. $V_{program'}$ is set higher than $V_{low}$. As a result, the electrical potential of the charge-storing gate electrode 106 becomes higher than $V_{low}$ through the capacitive coupling by the second capacitor 116 which is formed between the charge-storing gate electrode 106 and the second gate electrode 112 with the second insulating film 111 and the third capacitor 115 which is formed between the charge-storing gate electrode 106 and the conductive channel directly under the gate. Thus, in the same manner described above, if the electric field between the charge-storing gate electrode 106 and the first gate electrode 107 is sufficiently large, the electrons tunnel the third insulating film and are injected into the charge-storing gate electrode. Especially in a situation that the charge-storing gate electrode 106 overlaps from the upper surface to the side surface of the gate electrode as shown in FIG. 3, the sharp convex shape of the edge part of the first gate electrode 107 makes the electric field is high. Thus, the electrons tunnel from the edge part to the charge-storing gate electrode 106. As shown in FIG. 1c, if more than a certain number of electrons are injected into the charge-storing gate electrode 106, the threshold value of the FET, in which the first gate electrode 107 and the second gate electrode 112 are at a same electrical potential, becomes positive.

Figure 2A:
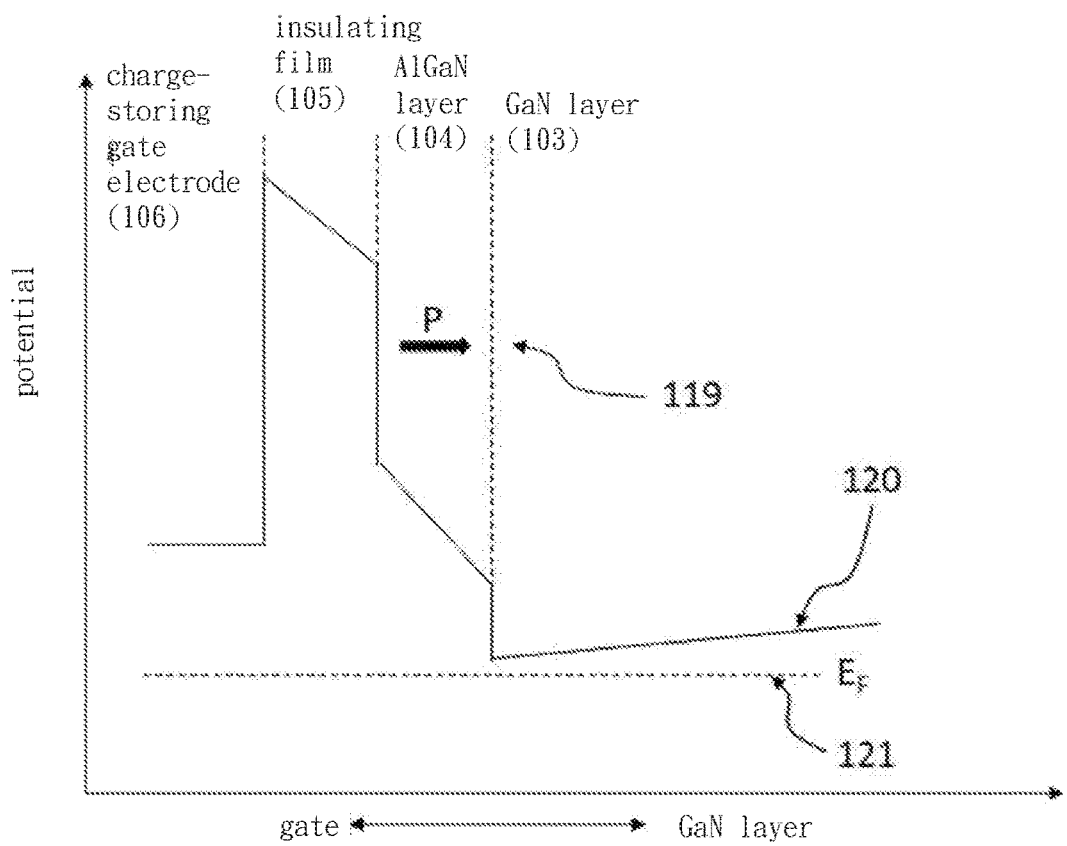
FIG. 2a shows a band diagram of a situation that a large amount of negative charge is stored in the charge-storing gate electrode.

FIG. 2a shows a band diagram of the FET in a normally-off situation. The band diagram shows a case that no voltage is applied to the first gate electrode 107 and the second gate electrode 112. If the stored charge 118 stored in the charge-storing gate electrode 106 is negative, the potential energy of the charge-storing gate electrode 106 increases. Therefore, even if a large falling of the potential energy is caused by a polarization (P) 119 which exists in the AlGaN layer 104, the lower edge of a conduction band 120 at the interface between the AlGaN layer 104 and the GaN layer 103 is still higher than the Fermi level ($E_F$) 121 due to the negative charge 118 which is sufficient in amount. Thus, the conduction electrons are not induced in the interface. That is, the threshold value shown in FIG. 1c becomes positive.

Figure 2B:
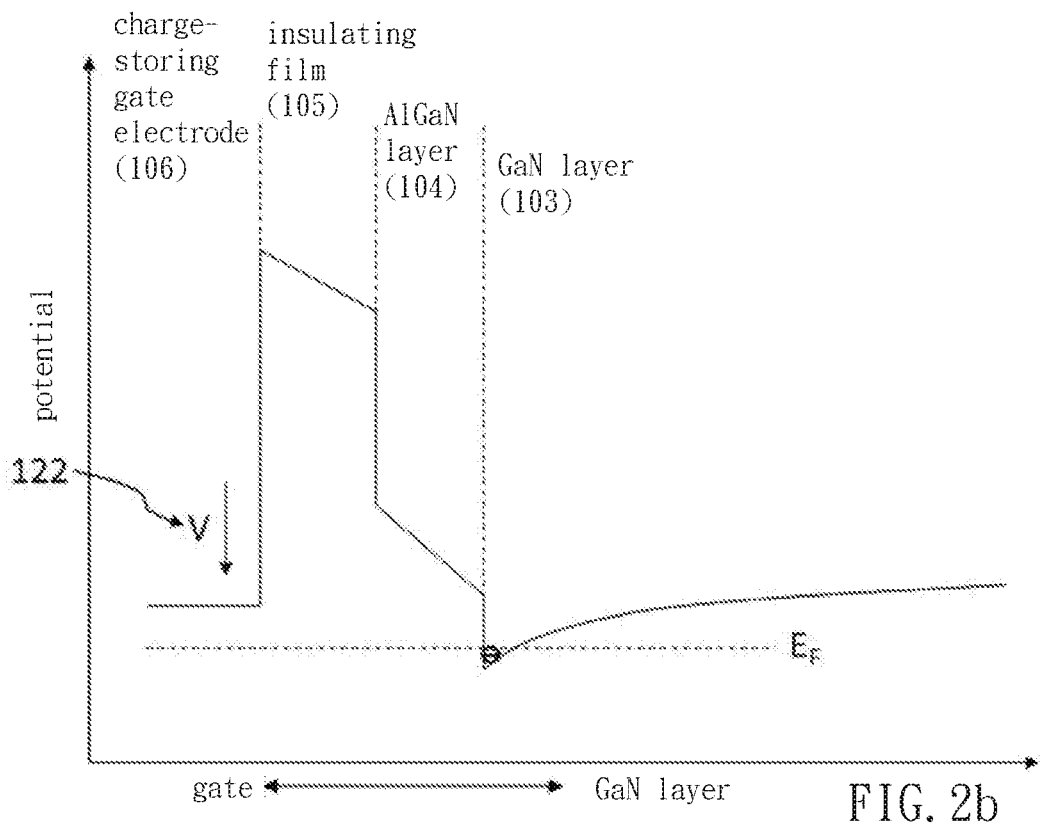
FIG. 2b shows a band diagram of the charge-storing gate electrode where the positive voltage is applied to the second gate electrode and the first gate electrode when a large amount of negative charge is stored in the charge-storing gate electrode.
Figure 2C:
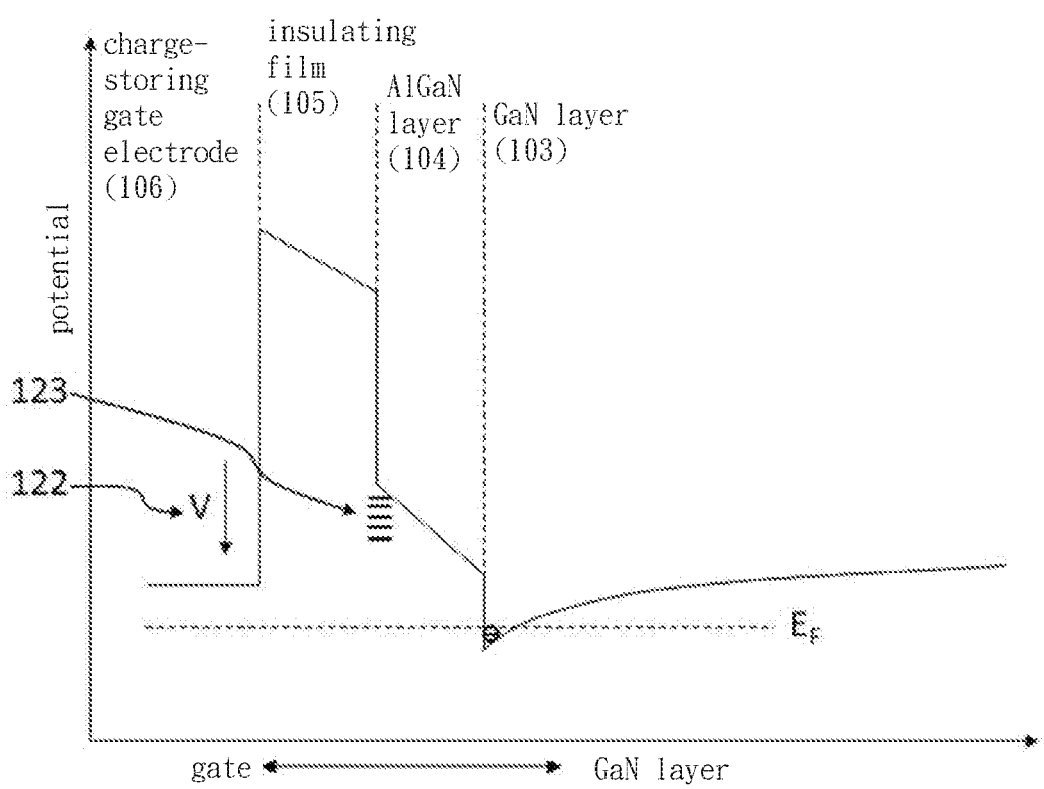
FIG. 2c shows a diagram showing an energy position of the interface energy level in the band diagram under the same condition as FIG. 2b.

FIG. 2b shows the band diagram in which the second gate electrode 112 and the first gate electrode 107 are in the same electrical potential, and a positive gate voltage is applied to the two gate electrodes. The effective positive voltage 122 (labeled as "V") is applied to the charge-storing gate electrode 106 as a result of the capacitive coupling shown in FIG. 1b. By doing this, at the interface between the AlGaN layer 104 and the GaN layer 103, the lower edge of the conduction band 120 is positioned lower than the Fermi level 121. Thus, conduction electrons are induced and the current flows through the conductive channel 110. In the embodiment, the transistor can be made normally-off by storing the negative charge in the charge-storing gate electrode 106 without reducing the thickness of the AlGaN layer 104 under the first gate electrode 107 and the charge-storing gate electrode 106. Therefore, there is no problem with the variation of the transistor characteristics such as the threshold value resulting from the variation of the remaining thickness after etching the AlGaN layer 104 in the conventional art. Besides, the AlGaN layer 104 under the charge-storing gate electrode 106 is thick enough. Thus, as shown in FIG. 2c, the energy of a trap level 123, which exists in the interface between the first insulating film 105 and the AlGaN layer 104, is higher than the Fermi level 121. Therefore, the induction of the electrons in the conductive channel 110 by applying the voltage to the first gate electrode 107 and the second gate electrode 112 is not hindered by the trap level 123.

In the embodiment, the situation that no etching of the AlGaN layer 104 under the charge-storing gate electrode 106 at all is described. However, the thickness of the AlGaN layer 104 can also be made smaller by etching to a certain degree. For example, similar to the structure shown in FIG. 9 of the conventional example, the device structure can also be formed by embedding the first insulating film 105, the charge-storing gate electrode 106 and the like into the recess etching part of the AlGaN layer 104. By making the thickness of the remaining AlGaN layer 104 large enough, the variation of the transistor characteristics, such as the threshold voltage, can be made smaller than the conventional art, and the influence of the trap level can also be avoided.

Figure 4:
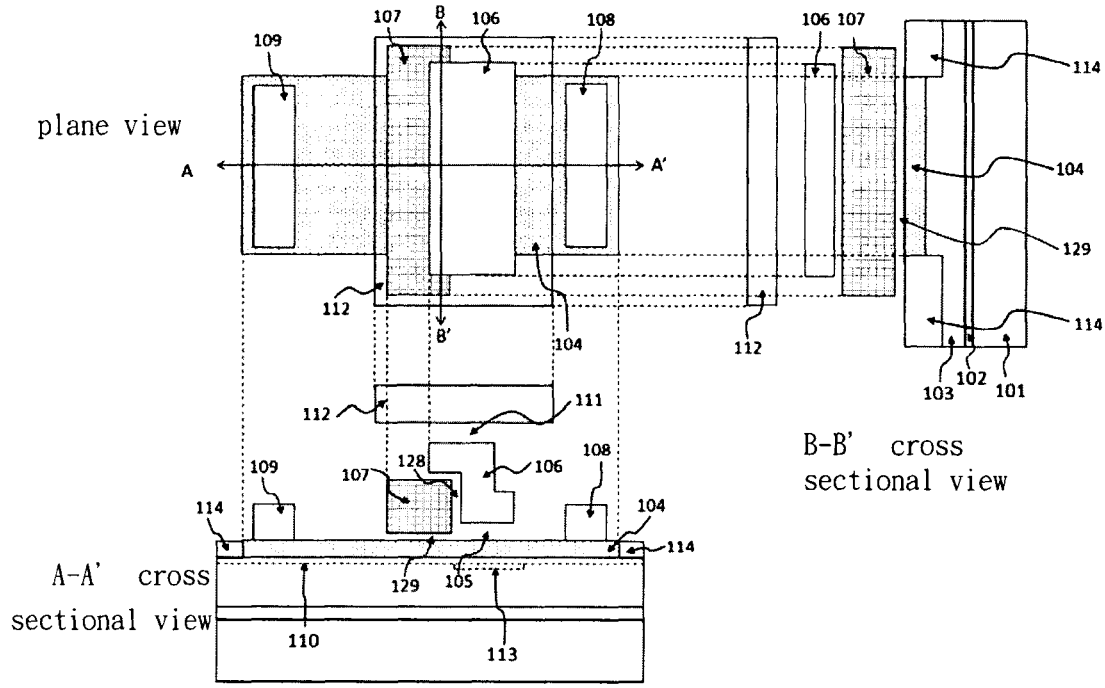
FIG. 4 shows a plane view and a cross sectional view of a FET of one form of the second embodiment of the application.

FIG. 4 shows a plane view of the FET of one form of the second embodiment of the application and a cross sectional view along lines A-A' and B-B' thereof. On the substrate 101, the buffer layer 102, the GaN layer 103 and the AlGaN layer 104 are laminated in order. The substrate 101 and the buffer layer 102 are formed of the same materials as the conventional example illustrated in FIG. 9. Then, as shown in the B-B' cross sectional view, the cell isolation region 114 is formed by making the AlGaN layer 104, even together with the GaN layer 103 and the buffer layer 102 thereunder, electrically inactive by ion implantation. Then, the first gate electrode 107 which is formed of a low resistance material, either a metal or a semiconductor, is disposed on the second nitride semiconductor layer 104 with a fourth insulating film 129 sandwiched therebetween. Furthermore, the charge-storing gate electrode 106 which is formed of a low resistance material, either a metal or a semiconductor, is disposed. The charge-storing gate electrode 106 is disposed adjacent to the side surface and the upper surface of the first gate electrode 107 with the third insulating film 128 sandwiched therebetween, and forms the first capacitor by capacitive coupling. Furthermore, regarding the charge-storing gate electrode 106, at least one part of the charge-storing gate electrode 106 is disposed on the second nitride semiconductor layer 104 with the first insulating film 105 sandwiched therebetween. The conductive channel 110 (which is induced at the interface between the GaN layer 103 and the AlGaN layer 104) and the charge-storing gate electrode 106 form the third capacitor by capacitive coupling. The third insulating film 128 can be formed of the same material of the insulating film at the time the first insulating film 105 is formed. Then, the second insulating film 111 is disposed on the charge-storing gate electrode 106, and the second gate electrode 112 is disposed on the second insulating film. Regarding the second gate electrode 112, at least one part of the second gate electrode 112 faces the upper surface of the charge-storing gate electrode 106 with the second insulating film 111 sandwiched therebetween, and the second capacitor is formed by capacitive coupling between the charge-storing gate electrode 106 and the second gate electrode 112. The source electrode 108 and the drain electrode 109 are disposed on the AlGaN layer 104 interposing the first gate electrode 107 and the charge-storing gate electrode 106 in the in-plane direction on the AlGaN layer 104. The voltage of the second gate electrode 112 or the voltage simultaneously applied to the first gate electrode 107 and the second gate electrode 112 can change the current flowing through the conductive channel 110 between the source electrode 108 and the drain electrode 109. The threshold value of a voltage applied to the second gate electrode 112 or a voltage simultaneously applied to the first gate electrode 107 and the second gate electrode 112 to cut off the current can be made positive by storing the negative charge in the charge-storing gate electrode 106. Besides, to prevent the leakage between the source electrode 108 and the drain electrode 109 of the FET, the edge of the first gate electrode and the edge of the charge-storing gate electrode 106 extend to the cell isolation region 114. In the regions between the source electrode 108 and the charge-storing gate electrode 106 and between the drain electrode 109 and the charge-storing gate electrode 106, the thickness of the AlGaN layer 104 is made about 10 nm or more to induce sufficient number of electrons in the conductive channel 110 at the AlGaN/GaN interface to reduce the resistance of those regions. The mixed crystal ratio x of AlN of the AlGaN layer 104 where the chemical formula is written as $Al_xGa_{1-x}N$ is properly adjusted so as to prevent the lattice relaxation from significantly occurring in AlGaN, which is different from GaN in the lattice constant. Typically, x is adjusted in a range from 0.1 to 0.4. The charge-storing gate electrode 106 is surrounded by the first insulating film 105, the second insulating film 111 and the third insulating film 128, and thus becomes electrically floating. Therefore, only the source electrode 108, the drain electrode 109, the first gate electrode 107 and the second gate electrode 112 are connected to external pins when packaged. Alternatively, there is also a way that the first gate electrode 107 and the second gate electrode 112 are short-circuited to make one external pin when packaged. Alternatively, the first gate electrode 107 can also be made floating and then packaged. The situation where there are four or three electrodes connected to the external pin is the same as the other embodiment described later. For the charge-storing gate electrode 106, a metal or a polycrystalline silicon doped with impurities can be used. For the polycrystalline silicon, phosphorus, arsenic, boron and the like are used as the impurities.

In the second embodiment of the application shown in FIG. 4, the first gate electrode 107 is disposed on the cell active region. Accordingly, in comparison with the first embodiment of the application shown in FIG. 1a, the distance between the source electrode 108 and the drain electrode 109 becomes larger, and the properties as a switch, such as the on-resistance, become worse. On the other hand, the first gate electrode is disposed on the drain electrode 109 side of the charge-storing gate electrode 106. Therefore, when a large voltage is applied to the drain electrode 109 while the switch is in a standby mode, most of the voltage is applied to the first gate, and the voltage drop between the first gate electrode 107 and the charge-storing gate electrode 106 is suppressed to a small value. Accordingly, the electrical field at the edge of the drain side of the charge-storing gate electrode 106 can be weakened, and an excessive electrical potential difference locally generated between the charge-storing gate electrode 106 and the AlGaN layer 104 can be suppressed. As a result, the discharge of the storage charge 118 in the charge-storing gate electrode 106 becomes less, and the aging variation of the threshold value can be suppressed.

The injection of electrons to the charge-storing gate electrode 106 can be performed by applying the electrical potential shown in Table 1 and Table 2 to each node same as the first embodiment.

Figure 5:
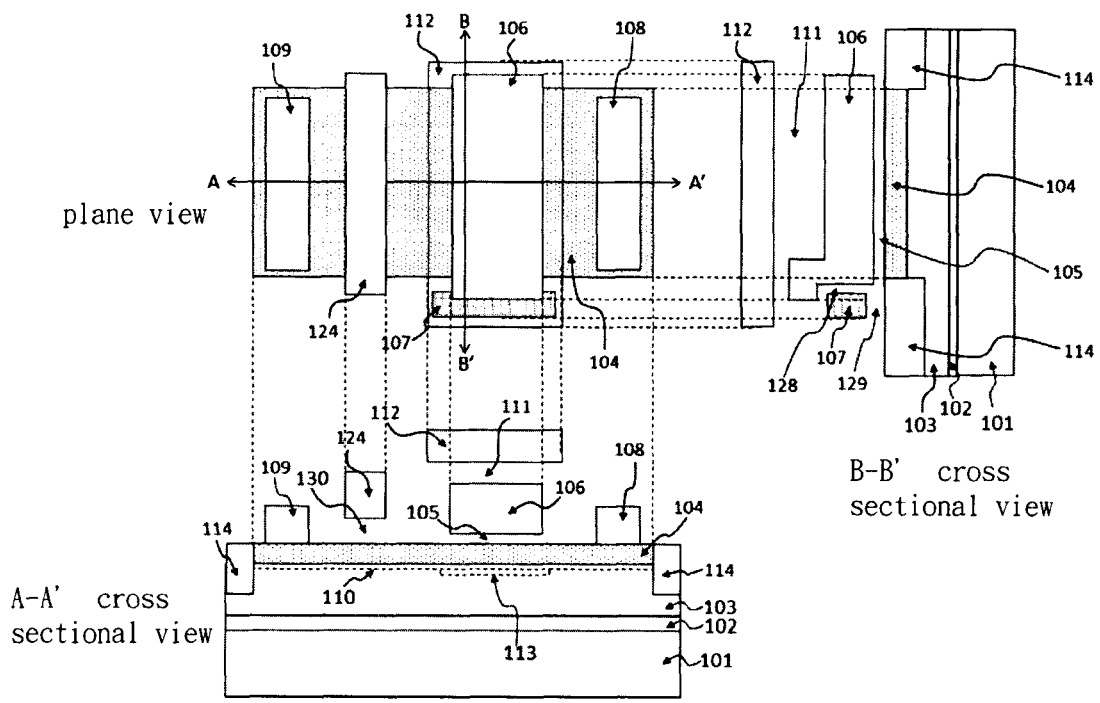
FIG. 5 shows a plane view and a cross sectional view of a FET of another form of the first embodiment of the application.

FIG. 5 shows the plane view and the cross-sectional view of the FET of another form of the first embodiment of the application. The present embodiment is based on the embodiment shown in FIG. 1a, with an insulating film 130 disposed on the AlGaN layer 104, the field plate 124 added on the insulating film 130. The other parts are the same as the first embodiment. As shown in the plane view and the A-A' cross sectional view, the field plate 124 is placed between the drain electrode 109 and the charge-storing gate electrode 106. The field plate 124 and the second gate electrode 112 can be formed of the same material at the same time. The field plate 124 is biased at almost the same electrical potential as the source electrode 108. Accordingly, even if a high voltage is applied to the drain electrode 109 in the standby state in which the voltages of the first gate electrode 107 and the second gate electrode 112 are 0V, the electric field at the edge of the drain side of the charge-storing gate electrode 106 can be reduced, and the excessive electrical potential difference locally generated between the charge-storing gate electrode 106 and the AlGaN layer 104 can be suppressed. As a result, the discharge of the storage charge 118 in the charge-storing gate electrode 106 becomes less, and the aging variation of the threshold value can be suppressed.

Figure 6:
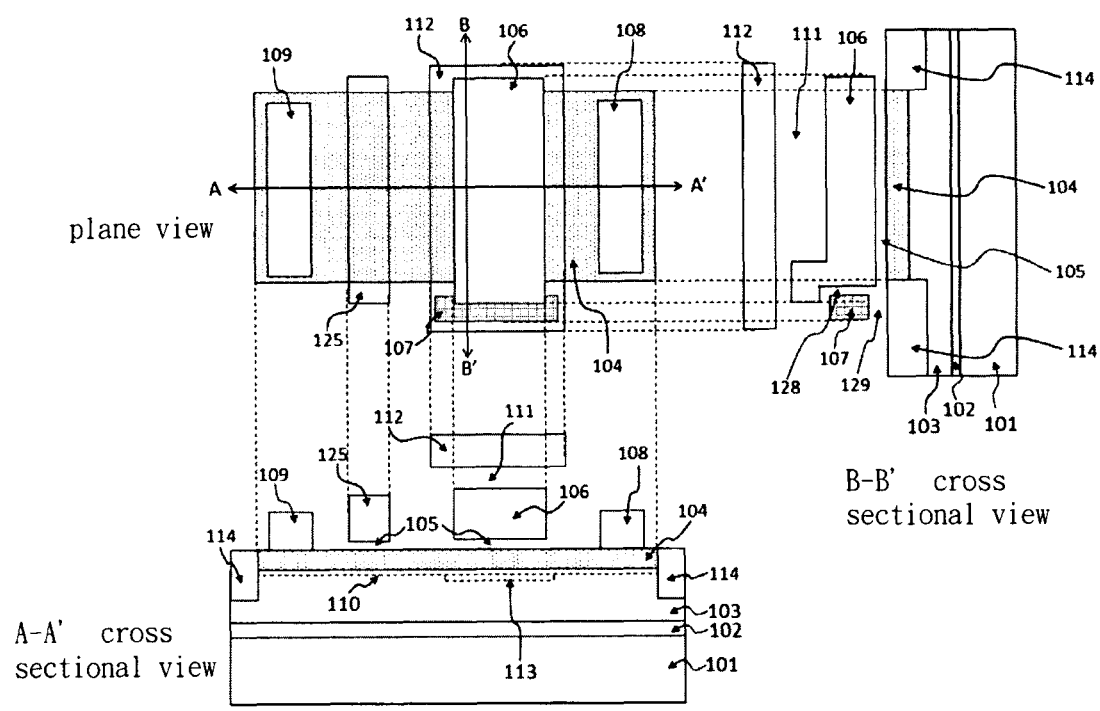
FIG. 6 shows a plane view and a cross sectional view of a FET of a further form of the first embodiment of the application.

FIG. 6 shows a plane view and a cross sectional view of the FET in another form of the first embodiment. This embodiment is similar to the embodiment shown in FIG. 1a, but has a third gate electrode 125 in addition between the charge-storing gate electrode 106 and the drain electrode 109. Accordingly, even if a high voltage is applied to the drain electrode 109 in the standby state in which the voltages of the first gate electrode 107 and the second gate electrode 112 are 0V, the electrical field at the edge of the drain side of the charge-storing gate electrode 106 can be reduced, and the excessive electrical potential difference locally generated between the charge-storing gate electrode 106 and the AlGaN layer 104 can be suppressed. As a result, the discharge of the storage charge 118 in the charge-storing gate electrode 106 becomes less, and the aging variation of the threshold value can be suppressed. The third gate electrode 125 is disposed on the first insulating film 105. The third gate electrode and the charge-storing gate electrode 106 can be formed of the same material at the same time. Besides, the insulating film under the third gate electrode 125 can be different from the first insulating film 105. Alternatively, the third gate electrode 125 can be directly formed on the second nitride semiconductor layer without an insulating film.

Figure 7:
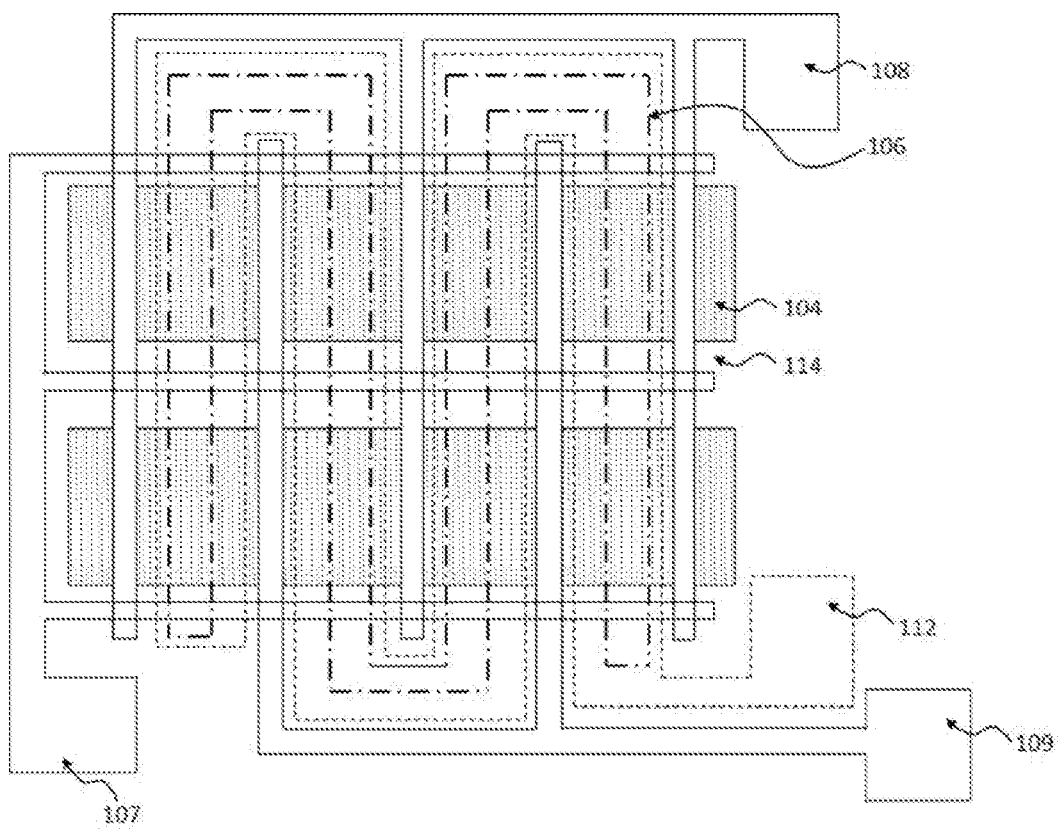
FIG. 7 is a plane view of a FET of yet a further form of the first embodiment of the application.

FIG. 7 shows a plane view of the FET in another form of the first embodiment of the application. The basic structure of the element in this embodiment is the same as the embodiment shown in FIG. 1a. However, in this embodiment, the source electrode 108 and the drain electrode 109 are formed of a plurality of fingers. The charge-storing gate electrode 106 and the second gate electrode 112 are disposed by sewing the finger interval between the source electrode 108 and the drain electrode 109. The first gate electrode 107 is disposed on the cell isolation region 114, and the first capacitor is formed between the first gate electrode 107 and the charge-storing gate electrode 106 with the third insulating film 128 as in the first embodiment. The capacitor 117 formed of the charge-storing gate electrode 106 and the first gate electrode 107 is placed in the cell isolation region 114 same as in the first embodiment. In this embodiment, a switching operation with a large current becomes possible having a plurality of source fingers and drain fingers to increase the total gate width of the FET.

FIG. 7 shows a situation of having a basic structure shown in FIG. 1a, while the field plate 124 can also be added as described in FIG. 5. In this case, the field plate 124 can also be disposed by sewing the finger interval between the source electrode 108 and the drain electrode 109, which is the same as the charge-storing gate electrode 106 and the second gate electrode 112. Furthermore, as shown in FIG. 6, the third gate electrode 125 can also be added. In this case, the third gate electrode 125 can also be disposed by sewing the finger interval between the source electrode 108 and the drain electrode 109, which is the same as the charge-storing gate electrode 106 and the second gate electrode 112.

Figure 8:
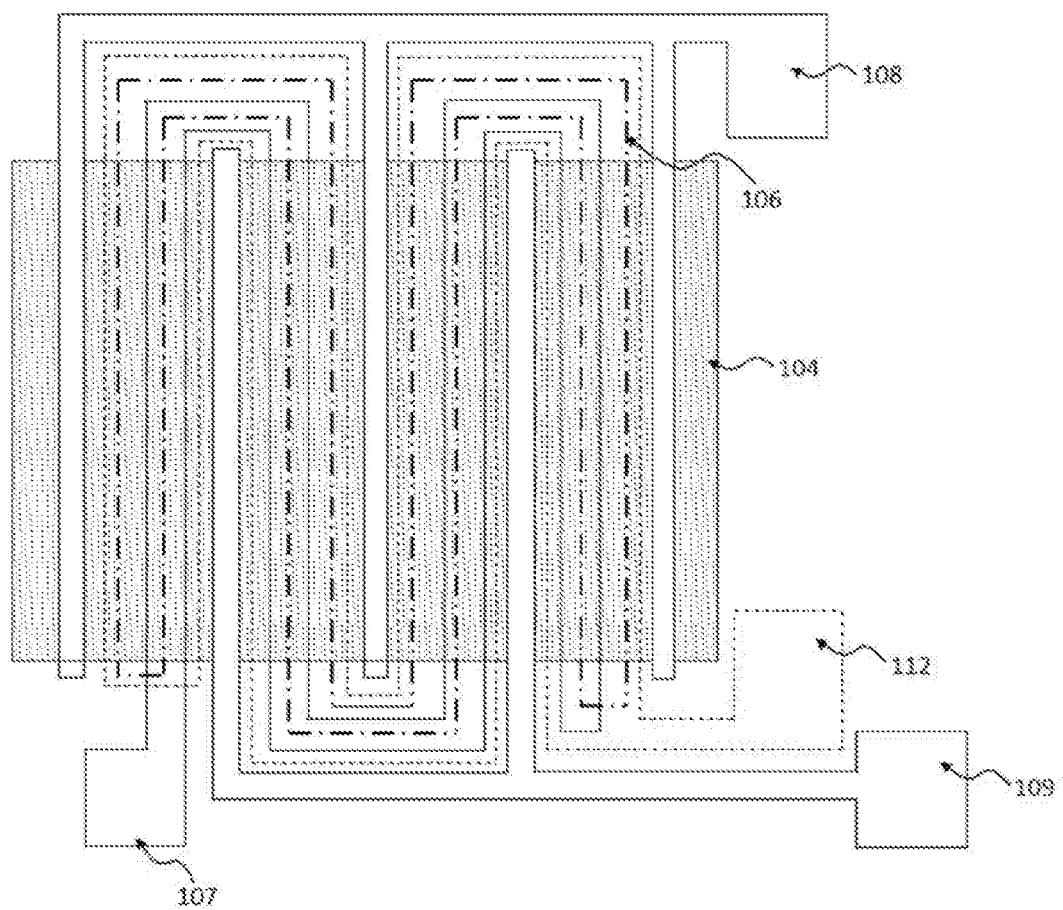
FIG. 8 shows a plane view and a cross sectional view of a FET of another form of the second embodiment of the application.

FIG. 8 shows the plane view of the FET of another form of the second embodiment. The basic structure of the element of the embodiment is the same as in the second embodiment shown in FIG. 4. However, in the embodiment, the source electrode 108 and the drain electrode 109 are formed of a plurality of fingers. The first gate electrode 107, the charge-storing gate electrode 106 and the second gate electrode 112 are disposed by sewing the finger interval between the source electrode 108 and the drain electrode 109. Accordingly, the switching operation with a large current becomes possible.

The nitride semiconductor FET of the embodiment can be used not only as a power switching element for a power supply circuit and the like, but also as a high frequency transistor. In this case, the second gate electrode 112 and the first gate electrode 107 are equivalent to the electrode generally called gate electrode in the high frequency transistor. Because the FET is normally-off, in other words an enhancement type, the voltages applied to the gate electrode and the drain electrode are both positive. Therefore, the transistor can be operated with a single positive supply voltage, and the simplification of the power source supply becomes possible. Besides, the AlGaN layer 104 under the first gate electrode 107 and the second gate electrode 112 both acting as the gate electrode is thick, so that the variation of the threshold voltage can be suppressed to a small value. Furthermore, the transistor characteristics are less affected by the trap level 123 which exists at the interface between the first insulating film 105 and the AlGaN layer 104. As a result, a high frequency transistor excellent in properties such as the transconductance and the maximum drain current can be obtained.

In the embodiment described above, the cases are described in which GaN and AlGaN are used for the nitride semiconductor. Because the band gap of AlGaN is larger than the band gap of GaN, the conductive channel is formed at the GaN side of the interface between AlGaN and GaN. This conductive channel is used in the embodiments described above. Nitride semiconductors other than GaN and AlGaN can also be used in this invention. For example, the nitride semiconductor containing In such as InN, InGaN, InAlN and the like, can also be used. Alternatively, a multi-layer structure of nitride semiconductors with different compositions can also be used. In this case, a material and a composition are chosen so that the main part of the lower layer is formed of a nitride semiconductor with a small band gap and the main part of the upper layer is formed of a nitride semiconductor with a large band gap.

Another nitride semiconductor different from the second nitride semiconductor in composition can also be inserted over the second nitride semiconductor surface, such as for the purpose of protecting its surface. For example, in the case that the first nitride semiconductor is made of GaN and the second nitride semiconductor is made of AlGaN, a thin GaN layer can also be inserted directly above AlGaN.

The nitride semiconductor transistor devices in this invention are useful mainly for power switch applications for a power supply circuit and the like. In addition, the device can also be adapted for a high frequency transistor used in a radio communication, a sensor and the like.

What is claimed is:

1. A nitride semiconductor transistor device comprising:
   a substrate;
   a first nitride semiconductor layer disposed over the substrate;
   a second nitride semiconductor layer disposed over the first nitride semiconductor layer and at least containing a nitride semiconductor with a band gap larger than a band gap of at least a part of the nitride semiconductor of the first nitride semiconductor layer;
   a first insulating film disposed over the second nitride semiconductor layer;
   a charge-storing gate electrode disposed over the first insulating film;
   a second insulating film disposed over the charge-storing gate electrode;
   a second gate electrode disposed over the second insulating film;
   a source electrode and a drain electrode disposed over the second nitride semiconductor layer interposing the charge-storing gate electrode in a plane direction;
   a cell isolation region which is electrically inactive and disposed on the substrate; and
   a first gate electrode capacitively coupling with the charge-storing gate electrode with a third insulating film therebetween forming a first capacitor,
   wherein a conductive channel is formed at the interface between the first nitride semiconductor and the second nitride semiconductor, wherein charge is stored in the charge-storing gate electrode to adjust a threshold voltage,
   wherein the threshold voltage is a threshold value of a voltage applied to the second gate electrode or a voltage applied to the second gate electrode and the first gate electrode simultaneously at which the current flowing between the source electrode and the drain electrode through the conductive channel is cut off,
   wherein the charge is stored in the charge-storing gate electrode by an electron injection from the first gate electrode through the first capacitor, and
   wherein an electrical potential of the second gate electrode is higher than an electrical potential of the first gate electrode at the time the charge is stored in the charge-storing gate electrode by the electron injection from the first gate electrode through the first capacitor.

2. The nitride semiconductor transistor device as claimed in claim 1, wherein the first gate electrode is disposed in the cell isolation region.

3. The nitride semiconductor transistor device as claimed in claim 2, wherein the third insulating film is formed at least partly in the cell isolation region, wherein the charge-storing gate electrode extends to the first gate electrode in the cell isolation region to form the first capacitor using the third insulating film as a capacitive coupling film.

4. The nitride semiconductor transistor device as claimed in claim 3, wherein the first capacitor comprises a convex edge portion formed by the first gate electrode and the charge-storing gate electrode with the third insulating film as the capacitive coupling film, and wherein the electron injection to the charge-storing gate electrode is made through a tunneling at the convex edge portion in the first capacitor.

5. The nitride semiconductor transistor device as claimed in claim 4, wherein at least a part of the third insulating film is formed by covering an upper surface and a side surface of the first gate electrode, wherein the convex edge portion is included in the first capacitor by disposing the charge-storing gate electrode to overlap with the first gate electrode from the upper surface to the side surface using the third insulating film covering the upper surface and the side surface of the first gate electrode as the capacitive coupling film.

6. The nitride semiconductor transistor device as claimed in claim 1, wherein the threshold voltage is positive.

7. The nitride semiconductor transistor device as claimed in claim 6, wherein the charge, which is stored in the charge-storing gate electrode, is adjusted by applying a voltage to the second gate electrode that is higher than a voltage of the first gate electrode while the source electrode and the drain electrode are floating, thus injecting electrons from the first gate electrode to the charge-storing gate electrode through the first capacitor.

8. The nitride semiconductor transistor device as claimed in claim 6, wherein the charge, which is stored in the charge-storing gate electrode, is adjusted by applying a voltage to the second gate electrode that is higher than the voltage of the first gate electrode, applying another voltage to the source electrode or the drain electrode or both that is higher than the voltage of the first gate electrode, thus injecting electrons from the first gate electrode to the charge-storing gate electrode through the first capacitor.

9. The nitride semiconductor transistor device as claimed in claim 1, wherein a third capacitor is formed between the charge-storing gate electrode and the conductive channel under the charge-storing gate electrode with the first insulating film sandwiched therebetween, wherein a second capacitor is formed between the charge-storing gate electrode and the second gate electrode with the second insulating film sandwiched therebetween, and wherein a capacitance of the second capacitor or a sum of capacitances of the first capacitor and the second capacitor is larger than a capacitance of the third capacitor.

10. The nitride semiconductor transistor device as claimed in claim 1, wherein the first nitride semiconductor layer is formed of GaN, and wherein the second nitride semiconductor layer is formed of $Al_xGa_{1-x}N$ where $0<x\le 1$.

11. The nitride semiconductor transistor device as claimed in claim 1, wherein at least a lowermost layer of the first insulating film is formed of aluminum oxide.

12. The nitride semiconductor transistor device as claimed in claim 1,
wherein the first gate electrode is disposed over the second nitride semiconductor layer,
wherein the third insulating film covers an upper surface and a side surface of the first gate electrode,
wherein the first capacitor is formed by the charge-storing gate electrode that extends to and overlaps with the upper surface to the side surface of the first gate electrode using the third insulating film as a capacitive coupling film.

13. A nitride semiconductor transistor device comprising:
a substrate;
a first nitride semiconductor layer disposed over the substrate;
a second nitride semiconductor layer disposed over the first nitride semiconductor layer and at least containing a nitride semiconductor with a band gap larger than a band gap of at least a part of the nitride semiconductor of the first nitride semiconductor layer;
a first insulating film disposed over the second nitride semiconductor layer;
a charge-storing gate electrode disposed over the first insulating film;
a second insulating film disposed over the charge-storing gate electrode;
a second gate electrode disposed over the second insulating film;
a source electrode and a drain electrode disposed interposing the charge-storing gate electrode in a plane direction;
a cell isolation region which is electrically inactive and disposed on the substrate; and
a first gate electrode capacitively coupling with the charge-storing gate electrode with a third insulating film therebetween forming a first capacitor,
wherein a conductive channel is formed at the interface between the first nitride semiconductor and the second nitride semiconductor,
wherein the source electrode and the charge-storing gate electrode are electrically connected to each other by the conductive channel, wherein the drain electrode and the charge-storing gate electrode are electrically connected to each other by the conductive channel,
wherein charge is stored in the charge-storing gate electrode to adjust a threshold voltage,
wherein the threshold voltage is a threshold value of a voltage applied to the second gate electrode or a voltage applied to the second gate electrode and the first gate electrode simultaneously at which the current flowing between the source electrode and the drain electrode through the conductive channel is cut off,
wherein the charge is stored in the charge-storing gate electrode by an electron injection from the first gate electrode through the first capacitor, and
wherein an electrical potential of the second gate electrode is higher than an electrical potential of the first gate electrode at the time the charge is stored in the charge-storing gate electrode by the electron injection from the first gate electrode through the first capacitor.

14. The nitride semiconductor transistor device as claimed in claim 13, wherein the first gate electrode is disposed in the cell isolation region.

15. The nitride semiconductor transistor device as claimed in claim 14, wherein the third insulating film is formed at least partly in the cell isolation region, wherein the charge-storing gate electrode extends to the first gate electrode in the cell isolation region to form the first capacitor using the third insulating film as a capacitive coupling film.

16. The nitride semiconductor transistor device as claimed in claim 15, wherein the first capacitor comprises a convex edge portion formed by the first gate electrode and the charge-storing gate electrode with the third insulating film as the capacitive coupling film, and wherein the electron injection to the charge-storing gate electrode is made through a tunneling at the convex edge portion in the first capacitor.

17. The nitride semiconductor transistor device as claimed in claim 16, wherein at least a part of the third insulating film is formed by covering an upper surface and a side surface of the first gate electrode, wherein the convex edge portion is included in the first capacitor by disposing the charge-storing gate electrode to overlap with the first gate electrode from the upper surface to the side surface using the third insulating film covering the upper surface and the side surface of the first gate electrode as the capacitive coupling film.

18. The nitride semiconductor transistor device as claimed in claim 13, wherein the threshold voltage is positive.

19. The nitride semiconductor transistor device as claimed in claim 18, wherein the charge, which is stored in the charge-storing gate electrode, is adjusted by applying a voltage to the second gate electrode that is higher than a voltage of the first gate electrode while the source electrode and the drain electrode are floating, thus injecting electrons from the first gate electrode to the charge-storing gate electrode through the first capacitor.

20. The nitride semiconductor transistor device as claimed in claim 18, wherein the charge, which is stored in the charge-storing gate electrode, is adjusted by applying a voltage to the second gate electrode that is higher than the voltage of the first gate electrode, applying another voltage to the source electrode or the drain electrode or both that is higher than the voltage of the first gate electrode, thus injecting electrons from the first gate electrode to the charge-storing gate electrode through the first capacitor.

21. The nitride semiconductor transistor device as claimed in claim 13, wherein a third capacitor is formed between the charge-storing gate electrode and the conductive channel under the charge-storing gate electrode with the first insulating film sandwiched therebetween, wherein a second capacitor is formed between the charge-storing gate electrode and the second gate electrode with the second insulating film sandwiched therebetween, and wherein a capacitance of the second capacitor or a sum of capacitances of the first capacitor and the second capacitor is larger than a capacitance of the third capacitor.

22. The nitride semiconductor transistor device as claimed in claim 13, wherein the first nitride semiconductor layer is formed of GaN, and wherein the second nitride semiconductor layer is formed of $Al_xGa_{1-x}N$ where $0<x\leq1$.

23. The nitride semiconductor transistor device as claimed in claim 13, wherein at least a lowermost layer of the first insulating film is formed of aluminum oxide.

24. The nitride semiconductor transistor device as claimed in claim 13,
wherein the first gate electrode is disposed over the second nitride semiconductor layer,
wherein the third insulating film covers an upper surface and a side surface of the first gate electrode,
wherein the first capacitor is formed by the charge-storing gate electrode that extends to and overlaps with the upper surface to the side surface of the first gate electrode using the third insulating film as a capacitive coupling film.

* * * * *